(12) United States Patent
Machul

(10) Patent No.: US 6,822,440 B2
(45) Date of Patent: Nov. 23, 2004

(54) INDUCTIVE PROXIMITY SENSOR

(75) Inventor: Olaf Machul, Freiburg (DE)

(73) Assignee: Sick AG, Waldkirch (DE)

(*) Notice: Subject to any disclaimer, the term of this patent is extended or adjusted under 35 U.S.C. 154(b) by 0 days.

(21) Appl. No.: 10/238,023

(22) Filed: Sep. 6, 2002

(65) Prior Publication Data
US 2003/0071638 A1 Apr. 17, 2003

(30) Foreign Application Priority Data
Sep. 7, 2001 (DE) .......................... 101 43 900

(51) Int. Cl.⁷ .......................................... G01R 33/025
(52) U.S. Cl. ................................................ 324/207.12
(58) Field of Search ....................... 324/207.12, 207.26, 324/207.15, 207.16, 207.17, 654, 76.75

(56) References Cited

U.S. PATENT DOCUMENTS 4,918,591 A * 4/1990 Link .......................... 363/39
5,065,093 A * 11/1991 Nauta et al. ............ 324/207.12
6,208,134 B1 * 3/2001 Demma .................. 324/207.26

FOREIGN PATENT DOCUMENTS

| DE | 2515654 B2 | 10/1976 |
|---|---|---|
| DE | 3731394 C2 | 3/1989 |
| EP | 0403733 A1 | 12/1990 |
| EP | 0523563 A1 | 1/1993 |

* cited by examiner

Primary Examiner—Anjan Deb
Assistant Examiner—Amy He
(74) Attorney, Agent, or Firm—Townsend and Townsend and Crew LLP

(57) ABSTRACT

An inductive proximity sensor has an oscillatory circuit (L, C, $R_p$), an electric energy source (11) coupled to the oscillatory circuit for compensating losses in the circuit, and a filter (15) for compensating signal changes encountered in the oscillatory circuit. The input of the filter is coupled to the oscillatory circuit and its output is coupled and sending output signals to the energy source. The energy source changes the energy or current supplied to the oscillatory circuit as a function of the output signals from the filter to thereby actively compensate for signal changes encountered in the oscillatory circuit.

7 Claims, 2 Drawing Sheets

INDUCTIVE PROXIMITY SENSOR

BACKGROUND OF THE INVENTION

The invention pertains to an inductive proximity sensor with an electrical oscillatory circuit and an electrical energy source coupled thereto for compensating losses in the oscillatory circuit.

Inductive proximity sensors are generally used in automation engineering for determining operating states of automated factories, manufacturing systems (e.g., welding robots) and processing plants. Such systems use proximity switches to detect the presence or absence of electrically conductive workpieces or machine parts. Along with position determination, such sensors can also be used, for example, for rpm and speed measurements on rotating or translationally moving parts.

On the input side, inductive proximity sensors have an LC oscillatory circuit (oscillator) subject to losses, the resistance $R_p$ of which can be influenced in a specific manner, for example by an approaching electrically conductive medium. By means of an evaluation circuit that is coupled with the oscillatory circuit, a corresponding change in the loss resistance $R_p$ can be detected for triggering a switching signal when used as a proximity switch, for example.

An energy source coupled with the oscillatory circuit is used to compensate for the losses in order to maintain oscillations. For example, an electrical compensating current can be supplied to the oscillatory circuit. The coupled energy source acts like a negative resistance because the voltage, which drops across the oscillatory circuit, and the compensating current that is coupled back in accordance with the reference arrow conventions are oppositely directed.

With inductive proximity sensors, electromagnetic disturbances encountered in rough industrial environments can be coupled in inductively or capacitively by implementing the sensor element as an LC oscillatory circuit. Magnetic couplings effectively exert a surge in the oscillatory circuit amplitude.

In contrast, in the case of capacitive couplings—depending on the phase position of the coupling—energy is withdrawn from or added to the oscillatory circuit, which temporarily has the effect of an unwanted change in the oscillatory circuit amplitude, because the energy that is coupled in or out capacitively can be supplied or discharged only through a loss resistance $R_P$. The amount of energy E that is coupled in or out is also dependent on the loss resistance $R_P$, i.e., a quality Q of the LC oscillatory circuit. The smaller the quality Q is, the better the energy can be coupled into or out of the oscillatory circuit. The time constant T for the relaxation of the disturbance that has been coupled in, i.e., the energy E that has been added, is thus dependent on the loss resistance $R_P$ of the oscillatory circuit. The higher the loss resistance, the more poorly the energy that has been coupled in is able to flow back out. In the same way, energy that is coupled out is most poorly restored when the loss resistance is low.

As a result, with known proximity sensors, coupled-in disturbances of this type can unintentionally trigger a switching signal or prevent formation of a switching signal when a proximate response element is present. Faulty switching can be successfully suppressed with the aid of presently known signal processing methods, but only with a substantial reduction of the usable signal bandwidth.

SUMMARY OF THE INVENTION

It is an object of the invention to suppress the faulty functioning of proximity sensors without reducing their usable signal bandwidth.

This object is attained for proximity sensors of the type mentioned above by coupling a filter on the input side with the oscillatory circuit and on the output side with the energy source to actively compensate for signal changes that are coupled into the oscillatory circuit. Signal changes can be caused by capacitive disturbances or by the approach of an object to be detected.

According to the invention, an additional path is provided via the filter for actively supporting the relaxation of the signal changes coupled into the oscillatory circuit. This active support of the attenuation of the signal change occurs by intermittently increasing or decreasing the amount of energy supplied by the electrical energy source to the oscillatory circuit in order to maintain the resonance oscillation as a function of the filter's output signal.

The proximity sensor of the invention thus has the advantage that the relaxation of the signal change is substantially accelerated. As a result, the switching frequency, i.e., the frequency with which the objects can be detected, increases substantially while the relaxation time in case of disturbances is substantially shortened. Thus, the time within which an approaching object can be detected in an undisturbed manner can be lengthened accordingly.

An additional advantage provided by the invention is that the active support of the relaxation can be implemented with minimal additional complexity because the energy source that is used to support the relaxation is already present.

As has been described, it is advantageous to use the filter's output signal in the energy source as an additional control signal for changing the energy supply to the oscillatory circuit. In other words, the relevant control input of the energy source is connected with the amplifier, which is present in any event, in such a way that the signals from the filter increase or decrease the periodic energy supply to the oscillatory circuit.

In connection with the present invention, the term "filter" is used and to be understood in the broadest sense. The filter can be configured as an analog, digital electrical or electronic filter, for example, as a highpass, lowpass or bandpass filter, or as a combination of these, and it can have any desired transmission characteristics.

For the additional control of the energy supply to the oscillatory circuit described herein, the output side of the filter is directly or indirectly connected to at least one control input of the energy source. For example, the necessary signal conversion such as a voltage/current conversion for further processing of the filter's output signal can take place between the filter output and the energy source.

On the input side, the energy source can be coupled directly or indirectly with the oscillatory circuit in order to take up the resonant frequency, and it can be connected on the output side with the oscillatory circuit in order to supply the energy maintaining the oscillations.

The filter can also be integrated into the energy source, provided the explained additional coupling path is implemented.

The filter and/or the energy source is preferably at least partially implemented as a CMOS device.

DESCRIPTION OF THE PREFERRED EMBODIMENTS

Figure 1:
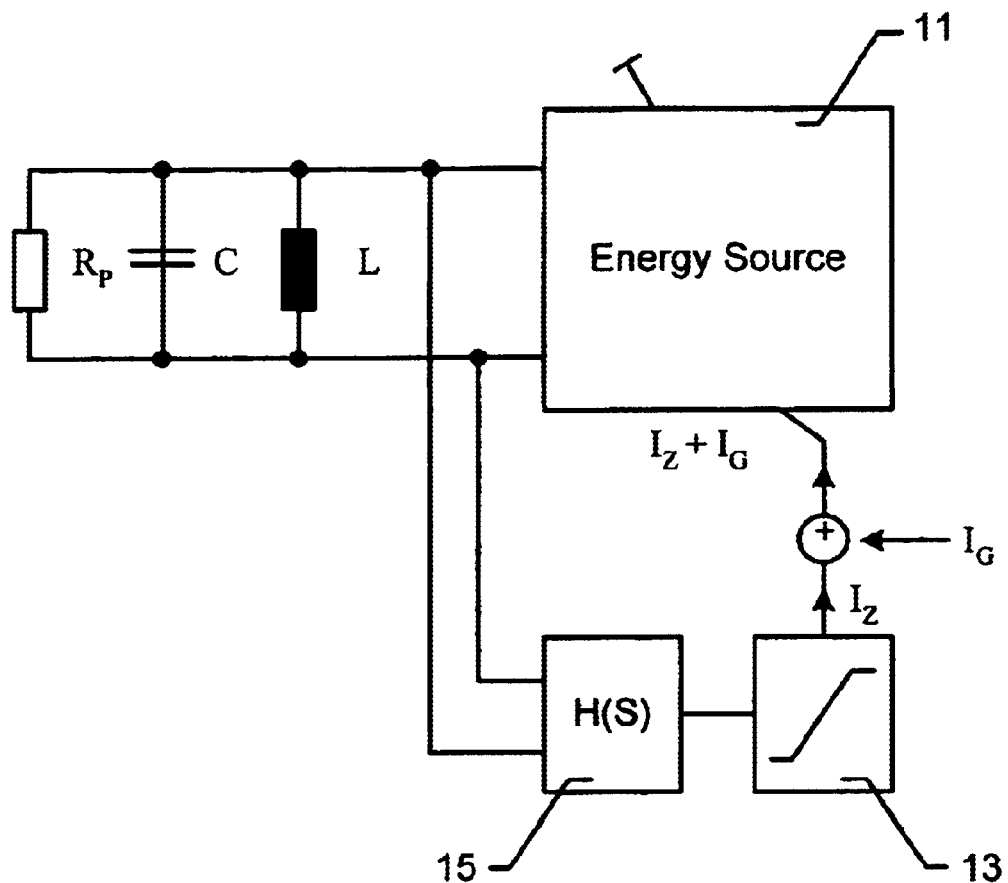
FIG. 1 is a block diagram of a portion of the proximity sensor according to the invention.

An inductive proximity sensor made according to the invention, a portion of which is shown in the block diagram of FIG. 1, has an LC oscillatory circuit on its input side comprising a coil L and a capacitor C, the loss resistance $R_P$ of which can be influenced in a specific manner, for example, by an approaching electrically conductive medium. An evaluation circuit (not shown in detail) is coupled to the oscillatory circuit for detecting changes in the loss resistance $R_P$ and therewith triggering switching signals, for example.

An energy source 11 coupled to the oscillatory circuit, for example a voltage/current converter and, specifically, a transconductance amplifier, is used to compensate for the losses to maintain oscillations. For this, an electrical compensating current $I_G$ is supplied to the oscillatory circuit. The coupled energy source 11 thus acts like a negative resistance $-R_P$, because the voltage, which drops across the oscillatory circuit, and the compensating current $I_G$ are opposites.

According to the invention, in the event of a signal change, the energy that is coupled in, i.e., the negative resistance $-R_P$ of the coupled energy source 11, is readjusted in such a way that the time constant T for the relaxation of the disturbance is shortened substantially.

However, the relaxation time T can be shortened only if the energy that is coupled in can be degraded more rapidly and the energy that is coupled out can be restored more rapidly. For that purpose, the negative resistance $-R_P$ of the energy source 11, with which oscillatory circuit losses are compensated, is at times decreased when additional energy is coupled in, and at times increased when energy is coupled out. The negative resistance action of the energy source 11 is changed by and controlled with an additional current $I_Z$. For this, signal changes of the energy source 11 are communicated via a filter 15 (which contains an appropriate transmission function H(s)) as control signals to an additional current source 13, that supplies the additional current $I_Z$.

Figure 2:
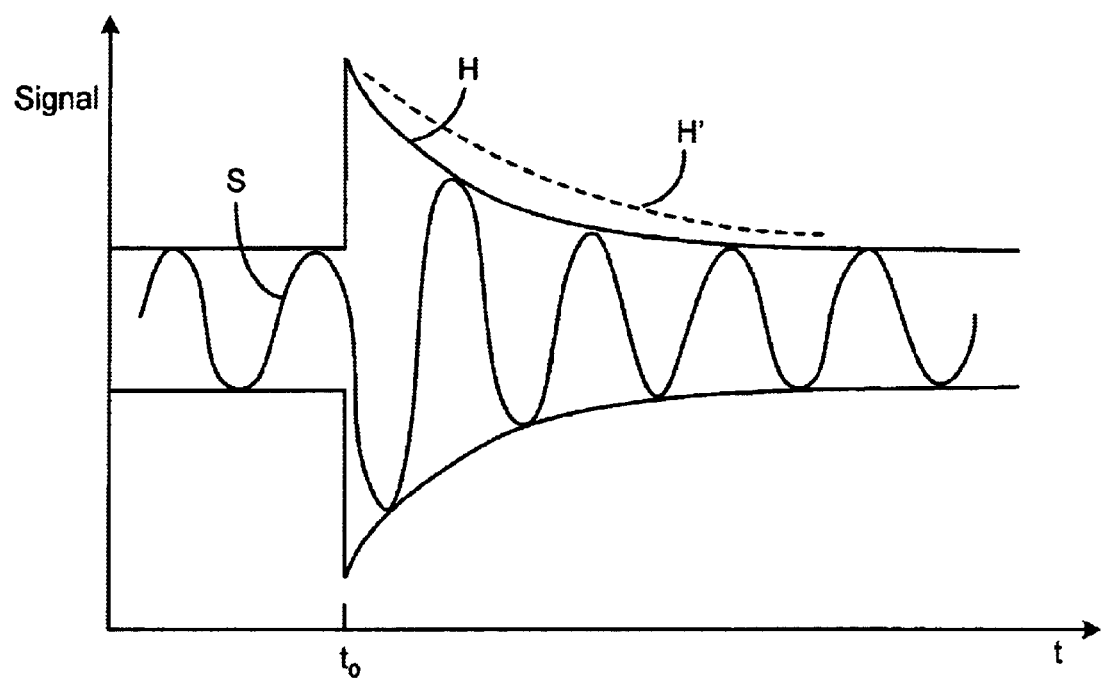
FIG. 2 shows a signal change influenced by a disturbance.
Figure 3:
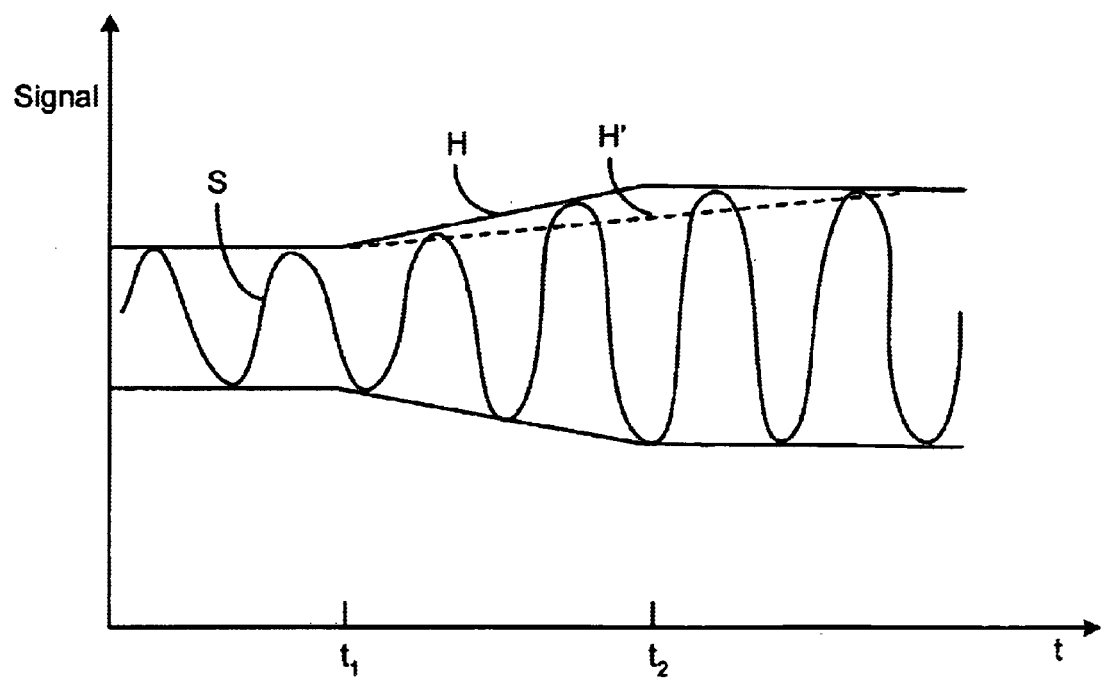
FIG. 3 shows a signal change caused by an approaching object to be detected.

The manner of functioning of the proximity sensor according to the invention is illustrated by FIGS. 2 and 3 where the signal, i.e., the oscillation S and its envelope H, are shown versus time with reference to two different situations.

FIG. 2 shows the signal curve when a brief disturbance occurs at $t=t_0$. At this point in time, the amplitude of the oscillation is greatly increased by the coupled-in disturbance. Further along the curve, this disturbance relaxes, and the amplitude drops back to the original value. The signal change from the disturbance is detected by filter 15 and a control signal according to the transmission function H(s) is generated and sent to additional current source 13. The additional current $I_Z$ together with the compensation current $I_G$ are sent to the energy source 11 to change the negative resistance of the energy source so that the signal change decays more rapidly. The more rapid relaxation is shown in FIG. 2, in that an envelope H' is shown in addition to envelope H. H' qualitatively shows the curve of the signal change when no additional current $I_Z$ is supplied.

FIG. 3 shows a signal curve where at a time $t=t_2$ an object to be detected comes into the effective range of the proximity sensor of the present invention. At $t=t_2$, the system has made a transition to the new amplitude caused by the presence of the object. In accordance with the invention, the time difference $t_2-t_1$, i.e., the relaxation time for this situation, is again shortened with the additional current $I_Z$ and the resulting change of the negative resistance $-R_P$ of energy source 11. Without the additional control by means of the additional current $I_Z$, the relaxation time $t_2-t_1$ would be longer, as is schematically indicated by the dashed line H' in FIG. 3.

The proximity sensor according to the invention thus has the advantage that the relaxation of a coupled-in disturbance is accelerated substantially. As a result, the period of time during which the approach of a response element can be detected in an undisturbed manner is lengthened accordingly.

The proximity sensor of the present invention additionally increases the usable switching frequency because, as a result of the intermittently active change of the loss resistance by the energy source, the energy stored in the LC oscillatory circuit can be degraded more rapidly upon the approach of a target, and the energy can be restored more rapidly when the target disappears.

An additional advantage of the invention is the fact that the active support of the relaxation as described herein can be implemented with minimal additional effort and/or complexity since the energy source used to support the relaxation is already present for maintaining oscillations.

The filter 15 can be configured as a highpass, bandpass or lowpass filter, or as a combination of these in analog or digital versions. The filter 15 and/or the energy source 11 is preferably implemented using the CMOS construction.

What is claimed is:

1. Inductive proximity sensor comprising an oscillatory circuit (L, C, $R_P$), an electric energy source (11) coupled to the oscillatory circuit for compensating losses in the circuit, and a filter (15) for compensating signal changes encountered in the oscillatory circuit, the filter having an input coupled to the oscillatory circuit and an output coupled and sending output signals to the energy source, the energy source changing one of the energy and current supplied to the oscillatory circuit as a function of the output signals from the filter output to thereby actively compensate for the signal changes in the oscillatory circuit.

2. Inductive proximity sensor according to claim 1 wherein the filter comprises one of a high-pass filter, a low-pass filter, a band-pass filter and a combination thereof.

3. Inductive proximity sensor according to claim 1 including a current/voltage converter placed between the filter output and a control input of the energy source for changing the supplied energy or current.

4. Inductive proximity sensor according to claim 1 wherein the energy source comprises a voltage/current converter.

5. Inductive proximity sensor according to claim 1 wherein the energy source comprises a transconductance amplifier.

6. Inductive proximity sensor according to claim 1 including a control circuit, and wherein the oscillatory circuit is coupled to the control circuit.

7. A method of compensating for signal changes in an oscillatory circuit of an inductive proximity sensor caused by an electrically conductive medium in the proximity of the sensor, comprising sensing signal changes in the oscillatory circuit, providing an electric energy source and a filter, coupling an input of the filter and an output of the energy source to the oscillatory circuit, coupling an output of the filter to a control input of the energy source, with the filter generating control signals responsive to the signal changes in the oscillatory circuit and sending the control signals to the control input, and changing an output of the electric energy source in accordance with the control signals to thereby compensate for the signal changes in the oscillatory circuit.

* * * * *